United States Patent
Kanapathippillai et al.

(10) Patent No.: US 6,944,087 B2
(45) Date of Patent: Sep. 13, 2005

(54) METHOD AND APPARATUS FOR OFF BOUNDARY MEMORY ACCESS

(75) Inventors: Ruban Kanapathippillai, Dublin, CA (US); Kumar Ganapathy, Palo Alto, CA (US); Thu Nguyen, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 10/076,966

(22) Filed: Feb. 15, 2002

(65) Prior Publication Data

US 2002/0131317 A1 Sep. 19, 2002

Related U.S. Application Data

(60) Provisional application No. 60/271,279, filed on Feb. 24, 2001.

(51) Int. Cl.[7] .............................................. G11C 11/00
(52) U.S. Cl. ........................ 365/230.06; 365/230.02; 365/230.03; 365/230.04; 365/230.01
(58) Field of Search ..................... 365/230.06, 230.02, 365/230.03, 230.04, 230.01

(56) References Cited

U.S. PATENT DOCUMENTS

| | | | |
|---|---|---|---|
| 4,432,055 A | | 2/1984 | Salas et al. |
| 4,959,776 A | * | 9/1990 | Deerfield et al. ............ 711/217 |
| 5,166,900 A | * | 11/1992 | Kondo .................. 365/185.11 |
| 5,285,421 A | | 2/1994 | Young et al. |
| 5,319,595 A | * | 6/1994 | Saruwatari ............. 365/189.01 |
| 5,327,389 A | * | 7/1994 | Seok et al. ............ 365/230.03 |
| 5,502,683 A | * | 3/1996 | Marchioro ............. 365/230.05 |
| 5,533,187 A | * | 7/1996 | Priem et al. ................ 345/545 |
| 5,806,082 A | | 9/1998 | Shaw |
| 5,901,105 A | * | 5/1999 | Ong et al. ............. 365/230.06 |
| 5,999,480 A | * | 12/1999 | Ong et al. ............. 365/230.06 |
| 6,009,019 A | | 12/1999 | Fang |
| 6,075,899 A | * | 6/2000 | Yoshioka et al. ........... 382/233 |
| 6,353,549 B1 | * | 3/2002 | Merritt ........................ 365/51 |
| 6,473,872 B1 | * | 10/2002 | Hoffman ..................... 714/718 |
| 2002/0056134 A1 | * | 5/2002 | Abe et al. ................... 725/120 |
| 2003/0056134 A1 | * | 3/2003 | Kanapathippillai et al. . 713/324 |

FOREIGN PATENT DOCUMENTS

| | | | | |
|---|---|---|---|---|
| JP | 361045338 A | * | 3/1986 | ........... G06F/11/22 |
| JP | 362025349 A | * | 2/1987 | ........... G06F/12/08 |
| JP | 362026548 A | * | 2/1987 | ........... G06F/12/04 |
| JP | 405020173 A | * | 1/1993 | ........... G06F/12/04 |

\* cited by examiner

*Primary Examiner*—Viet Q. Nguyen
(74) *Attorney, Agent, or Firm*—Ami Patel Shah (57) ABSTRACT

Disclosed is a method and apparatus for an off boundary memory to provide off boundary memory access. The off boundary memory includes a right memory array having a plurality of right memory rows and a left memory array having a plurality of left memory rows. This forms a memory having a plurality of row lines, each row line having a right memory row and a left memory row, respectively. An off boundary row address decoder is coupled to both the right and left memory arrays and is capable of performing an off boundary memory access which includes accessing a desired plurality of memory addresses from one of a right or left memory row of a row line and from one of a left or right memory row of an adjacent row line at substantially the same time within one memory access cycle.

24 Claims, 7 Drawing Sheets

METHOD AND APPARATUS FOR OFF BOUNDARY MEMORY ACCESS

CROSS REFERENCE TO RELATED APPLICATION

This non-provisional U.S. patent application claims the benefit of U.S. Provisional Application No. 60/271,279 filed on Feb. 24, 2001 by inventors Thu Nguyen et al entitled "METHOD AND APPARATUS FOR OFF BOUNDARY MEMORY ACCESS".

FIELD OF THE INVENTION

The invention relates generally to the field of memory. Particularly, the invention relates to off boundary memory access.

BACKGROUND OF THE INVENTION

Memory integrated circuit devices are well known. Memory cells can be read only (ROM), randomly accessible (RAM), static (SRAM), semi-static, dynamic (DRAM), programmable (PROM, EPROM, EEPROM), volatile, non-volatile (NVRAM) or of another memory type. The technology of transistor circuits used to form the memory cells can be varied as well. Exemplary types of technologies used include NMOS, PMOS, CMOS, bipolar, bi-CMOS or another circuit or technology type.

Typically, the memory cells are arranged in an array or matrix of memory cells and are accessed using column and row address decoders. The row address decoder typically generates a signal on a word line to select a desired row of memory cells. The column decoder then selects desired bit lines for certain memory cells in the row. Depending upon whether a write or read operation is desired, data is written into the selected memory cells or read out of the selected memory cells respectively. The organization of the array or matrix of memory cells can be varied. For a given capacity or total number of memory cells, they can be arranged so that N W-bit words can be accessed. For each address, a W-bit word is accessed providing W bits of data. Exemplary word widths, W, include 1 bit, 4 bits, 8 bits, 16 bits, 32 bits, and 64 bits. The number of words, N, then depends upon the desired capacity. Examples for the number of words include 1024 (1K) words; 4096 (4K) words, (1 meg) words. The total capacity of the memory in bits is then the product of the number of words and the number of bits per word (N×W).

Depending upon the organization of the memory, an address boundary of some type is usually associated with the memory. Typically, the upper bit or bits of the address establish an address boundary. For example, some memory devices are arranged or include circuitry to provide page mode addressing. Once a particular page has been accessed, accessing memory cells within the same page of addresses is typically faster. However if the page boundary is crossed by addressing a different page, the initial access within the new page is slower. An address boundary can be smaller than a page depending upon the memory type. The access time across a boundary is oftentimes an important performance consideration in memory selection.

The performance of memory integrated circuit devices, including power and speed, is often times very important in the selection of circuitry, organization and capacity. The performance of memory integrated into other types of integrated circuits can be an important consideration as well. Today some integrated circuits, including microprocessor integrated circuits, microcomputer integrated circuits, application specific integrated circuits, custom integrated circuits, digital signal processing integrated circuits, and application specific signal processing integrated circuits, commonly have large blocks of memory circuitry therein. Because memory has become much larger in these integrated circuits, the performance of memory has become very important.

BRIEF DESCRIPTIONS OF THE DRAWINGS

Like reference numbers and designations in the drawings indicate like elements providing similar functionality. A letter after a reference designator number represents an instance of an element having the reference designator number.

DETAILED DESCRIPTION

In the following detailed description, numerous specific details are set forth in order to provide a thorough understanding of the invention. However, that the embodiments of the invention may be practiced without these specific details. In other instances well known methods, procedures, components, and circuits have not been described in detail so as not to unnecessarily obscure aspects of the invention. Furthermore, the invention will be described in particular embodiments but may be implemented in hardware, software, firmware or a combination thereof.

The invention provides a method and apparatus for an off boundary memory to provide off boundary memory access. In one embodiment of this invention, an off boundary memory includes a right memory array having a plurality of right memory rows and a left memory array having a plurality of left memory rows. This forms a memory having a plurality of row lines, each row line having a right memory row and a left memory row, respectively. An off boundary row address decoder is coupled to both the right and left memory arrays and is capable of performing an off boundary memory access which includes accessing a desired plurality of memory addresses from one of a right or left memory row of a row line and from one of a left or right memory row of an adjacent row line at substantially the same time within one memory access cycle.

Thus, a plurality of data words can be accessed from any point in memory at substantially the same time within one memory access cycle. This avoids limitations of previous memories which often need two memory access cycles (i.e. requiring an extra re-alignment instruction) when an off boundary memory access is required.

Figure 2:
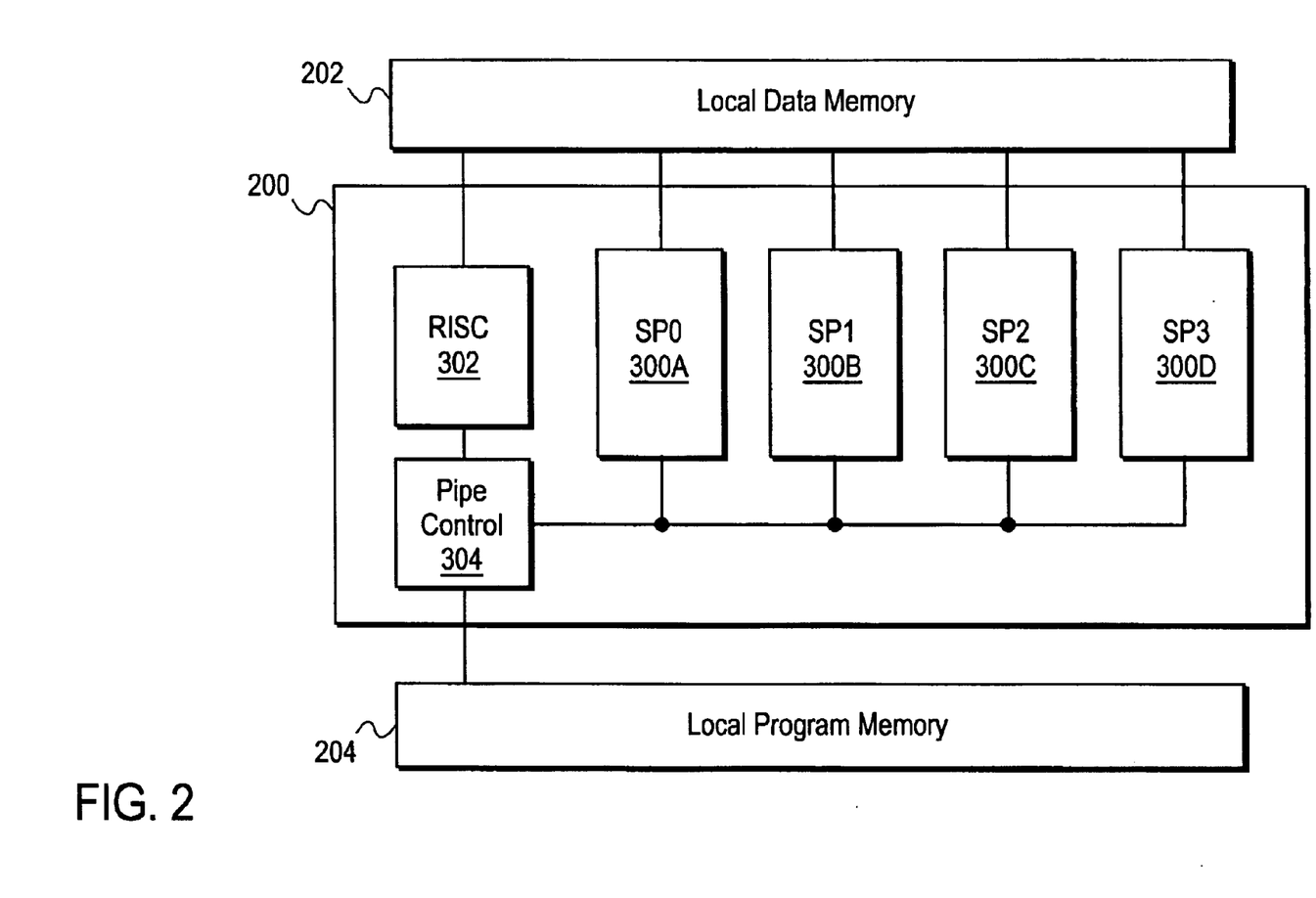
FIG. 2 is a block diagram of an instance of one of the core processors according to one embodiment of the invention within an ASSP.

Furthermore, the invention for an off boundary memory works with the architecture of a core signal processor 200 for performing digital signal processing instructions. As shown in FIG. 2, in one embodiment, the core signal processor 200 has four signal processing units 300A–D coupled to a local data memory 202 by a data bus 203. By using the off boundary memory 202 according to one embodiment of the invention, data can be more efficiently fed to signal processing units 300. For example, four data words can be accessed from the off boundary memory 202 at a time and each data word can be fed to a signal processing unit 300 simultaneously for digital signal processing. If the starting address of a data word requires an off boundary memory access this does not significantly slow down the operation of the four signal processors as the four data words can be accessed from the off boundary local memory at substantially the same time within one memory cycle. In this way, the invention for an off boundary memory increases the efficiency of the execution of digital signal processing (DSP) instructions on accessed data by the four signal processing units.

Figure 1:
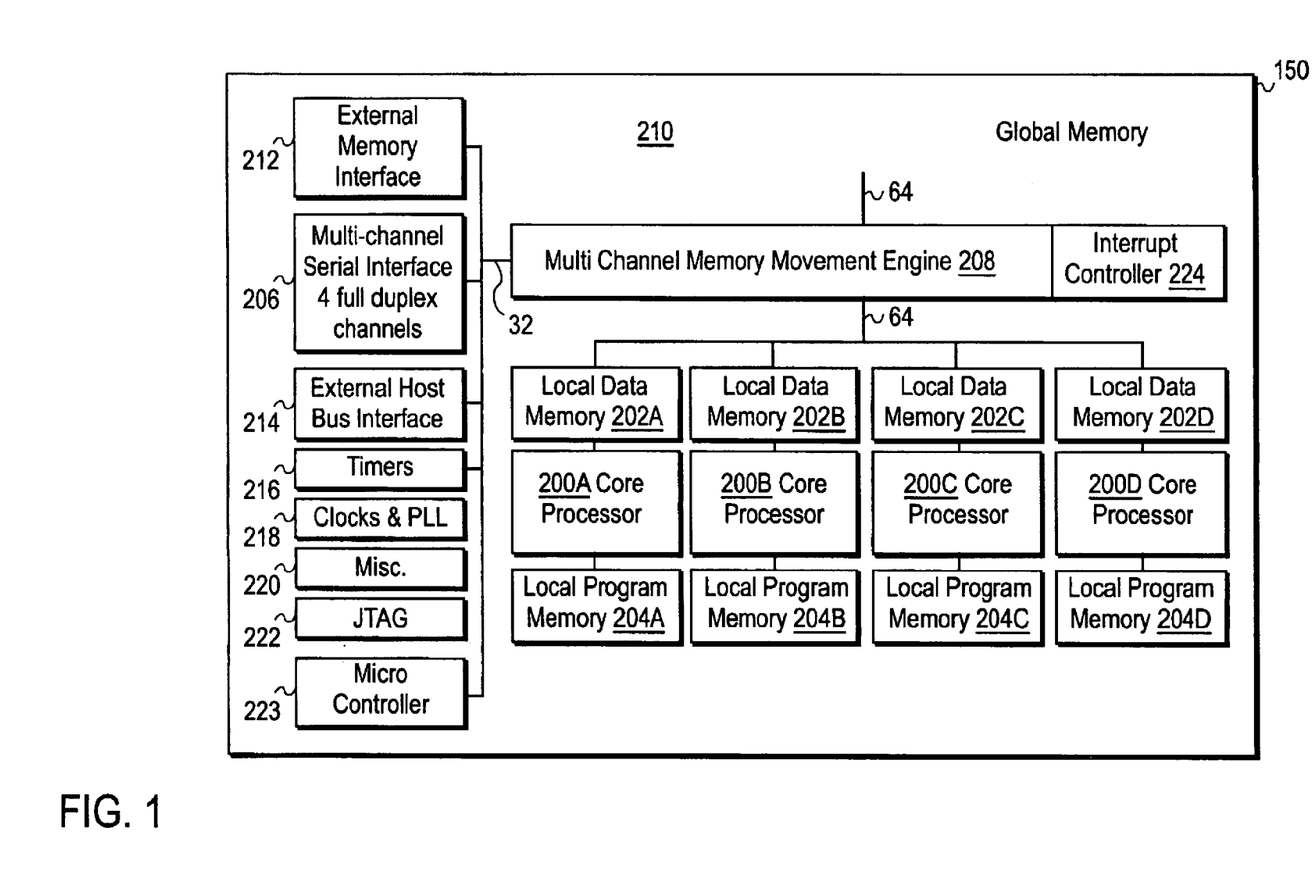
FIG. 1 is a block diagram of an Application Specific Signal Processor (ASSP) according to one embodiment of the invention.

Referring now to FIG. 1, a block diagram of the application specific signal processor (ASSP) 150 is illustrated. At the heart of the ASSP 150 are four core processors 200A–200D. Each of the core processors 200A–200D is respectively coupled to a data memory 202A–202D and a program memory 204A–204D. Each of the core processors 200A–200D communicates with outside channels through the multi-channel serial interface 206, the multi-channel memory movement engine 208, buffer memory 210, and data memory 202A–202D. The ASSP 150 further includes an external memory interface 212 to couple to an optional external local memory. The ASSP 150 includes an external host interface 214 for interfacing to an external host processor. Further included within the ASSP 150 are timers 216, clock generators and a phase-lock loop 218, miscellaneous control logic 220, and a Joint Test Action Group (JTAG) test access port 222 for boundary scan testing. The ASSP 150 further includes a microcontroller 223 to perform process scheduling for the core processors 200A–200D and the coordination of the data movement within the ASSP as well as an interrupt controller 224 to assist in interrupt handling and the control of the ASSP 150.

Referring now to FIG. 2, a block diagram of the core processor 200 is illustrated coupled to its respective data memory 202 and program memory 204. Core processor 200 is the block diagram for each of the core processors 200A–200D. Data memory 202 and program memory 204 refers to a respective instance of data memory 202A–202D and program memory 204A–204D, respectively. The core processor 200 includes four signal processing units SP0 300A, SP1 300B, SP2 300C and SP3 300D. The core processor 200 further includes a reduced instruction set computer (RISC) control unit 302 and a pipeline control unit 304. The signal processing units 300A–300D perform the signal processing tasks on data while the RISC control unit 302 and the pipeline control unit 304 perform control tasks related to the signal processing function performed by the SPs 300A–300D. The control provided by the RISC control unit 302 is coupled with the SPs 300A–300D at the pipeline level to yield a tightly integrated core processor 200 that keeps the utilization of the signal processing units 300 at a very high level. Further, the signal processing units 300A–300D are each connected to data memory 202, to each other, and to the RISC 302, via data bus 203, for the exchange of data (e.g. operands).

The signal processing tasks are performed on the data paths within the signal processing units 300A–300D. The nature of the DSP algorithms are such that they are inherently vector operations on streams of data, that have minimal temporal locality (data reuse). Hence, a data cache with demand paging is not used because it would not function well and would degrade operational performance. Therefore, the signal processing units 300A–300D are allowed to access vector elements (the operands) directly from data memory 202 without the overhead of issuing a number of load and store instructions into memory, resulting in very efficient data processing. Thus, the instruction set architecture of the invention having a 20 bit instruction word which can be expanded to a 40 bit instruction word, achieves better efficiencies than VLIW architectures using 256-bits or higher instruction widths by adapting the ISA to DSP algorithmic structures. The adapted ISA leads to very compact and low-power hardware that can scale to higher computational requirements. The operands that the ASSP can accommodate are varied in data type and data size. The data type may be real or complex, an integer value or a fractional value, with vectors having multiple elements of different sizes. The data size in the preferred embodiment is 64 bits but larger data sizes can be accommodated with proper instruction coding.

Figure 3A:
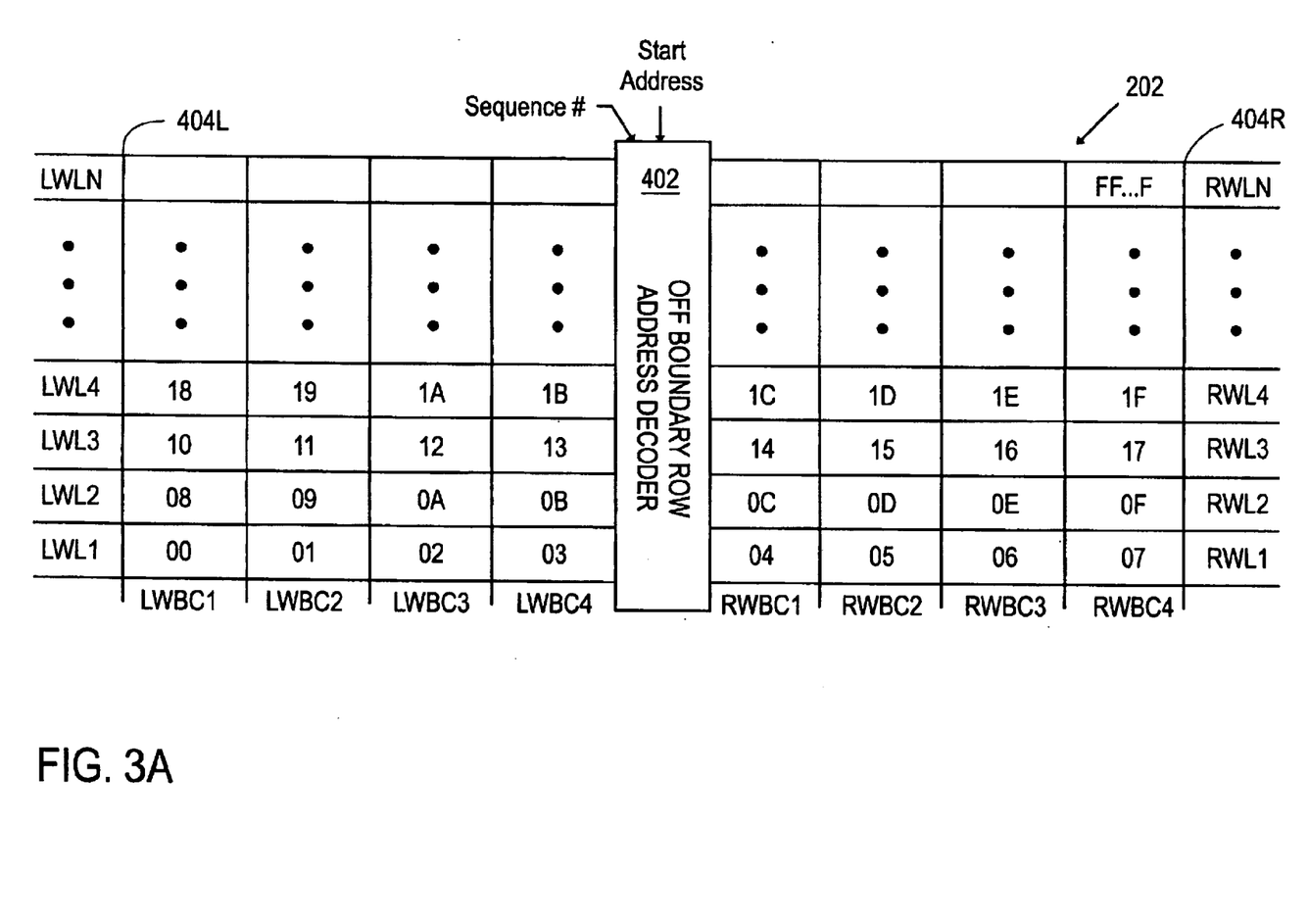
FIG. 3A is a diagram illustrating the functionality of an off boundary access memory according to one embodiment of the invention.

FIG. 3A is a diagram illustrating the functionality of an off boundary access memory according to one embodiment of the invention. Referring now to FIG. 3A, addresses associated with the words of the local data access memory 202 (FIG. 2) are illustrated. Each word can have W bits. In one embodiment the words are 16 bits wide. However other word sizes are possible, e.g. 8 bits, 32 bits, 64 bits, etc. The addresses are shown in hexadecimal beginning with the hex address 00 ($00_h$) as the first word within the memory. Further, the local data memory 202 is divided into a right memory array 404R and a left memory array 404L.

An off boundary row address decoder 402 according to one embodiment of the invention is coupled to the right memory array 404R and the left memory array 404L. The off boundary row address decoder 402 divides the local data memory 202 into row lines (sometimes referred to as word lines) for the left memory array (e.g. left memory row lines) and right memory array 404R (e.g. right memory row lines), as will be discussed later. Each row line includes a right memory row and a left memory row, respectively. The row lines are denoted at the far left and far right of each memory row, respectively (e.g. Right Word Lines (RWL1 . . . RWLN), Left Word Lines (LWL1 . . . LWLN)).

The local data memory 202 illustrated in FIG. 3A is eight columns across but can be expanded to have other numbers of columns (e.g. each word within a respective column) that are accessible within each row. For each column there is an indicator of the bit line that is selected to select each word, respectively (e.g. left word bit columns (LWBCs) and right word bit columns (RWBCs)). For example, to select the word address hex 00 ($00_h$) the left word bit column 1 (LWBC1) is selected while the left row line 1 (LWL1) is selected. As another example to access the word at address $04_h$, the right row line 1 (RWL1) is selected and the right word bit column 1 (RWBC1) is selected.

To access more than one word, a sequence of one, two, three or four words is selected for access beginning with the starting address. The off boundary row address decoder receives the start address and the sequence number, to represent more than one, two, three, or four words, which are to be accessed at substantially the same time. If additional words are provided then other decoding is provided and additional word sequences can be read or written into the memory 202.

Determining whether or not a memory access for a desired plurality of memory addresses is an off boundary memory access depends on a number of factors including the starting address and the sequence number for the number of words to be accessed. Generally, an off boundary access occurs when the starting address begins in the right word bit column 2 (RWBC2) or greater and the sequence number designates a word in a row which is accessed by an adjacent left world line (LWL) (e.g. in a higher or lower row).

For example, for the starting address of $07_h$, the right word line 1 (RWL1) is enabled and the bit line for the right word bit column 4 (RWBC4) is enabled to select address $07_h$. With a sequence number of two, three, or four, additional addresses are selectable at the data addresses $08_h$, $09_h$, and $0A_h$, respectively. For example, if the sequence number is 2, the data at the addresses $07_h$ and $08_h$ are to be accessed. This requires an off boundary access. Data at address $08_h$ is selected by enabling the left word line 2 (LWL2) and the left word bit column 1 (LWBC1). In order to access data at address $08_h$, the left word line 2 (LWL2) is turned on and the left word line 1 (LWL1) is turned off. Accordingly, in this example, the local memory 202 accesses both sets of data at addresses $07_h$ and $08_h$, within approximately one memory cycle at substantially the same time.

As an example of a non-off boundary access, consider a case where the address $0B_h$ is the starting address and the sequence number is 4. In this case data at address $0B_h$, $0C_h$, $0D_h$ and $0E_h$ are to be accessed as a group, together. In this case there is not an off boundary memory access and similarly positioned word lines, left word line 2 (LWL2) and right word line 2 (RWR2) are access together. The bit lines are selected by activating the appropriate column addressing (e.g. the left and right word bit columns) via a left sense amp array and a right sense amp array, as will be discussed. In FIG. 3A this would be a LWBC4, RWBC1, RWBC2, and RWBC3.

With a sequence number of 4 as a limit for the number of sequences of words that can be selected, starting addresses that result in column selection of LWBC1–LWBC4 and RWBC1 do not result in an off boundary memory access. On the other hand, starting addresses that result in word bit columns RWBC2, RWBC3, and RWBC4 being selected, can result in an off boundary memory access if the sequence number is appropriate. As previously discussed, an off boundary memory access occurs when the addresses for each word selected from left to right results in moving from a lower right word line to a next higher left word line. Alternatively, in case the row address decoding was from right to left (instead of left to right), the opposite would occur in which the operation would move from a higher right word line to the next lower the left word line. Also, if this were the case, the column decoding would be swapped.

Figure 3B:
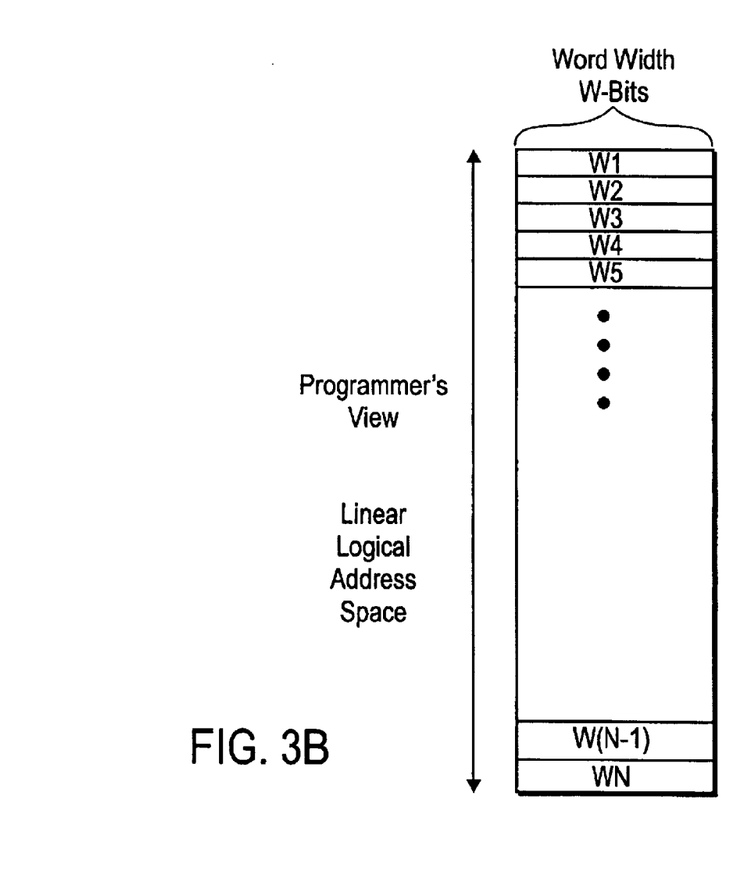
FIG. 3B is diagram illustrating a programmer's view of a local data memory according to one embodiment of the invention.

FIG. 3B is diagram illustrating a programmer's view of a local data memory according to one embodiment of the invention. Referring now to FIG. 3B, the local data memory 202 is accessible by a programmer from a starting rear address W1. Each word is W bits wide and the addresses progress in a linear fashion over a linear logical address space from word W1 to word WN. Unfortunately, it is difficult to provide a linear logical memory address space in such a fashion in hardware.

Figure 3C:
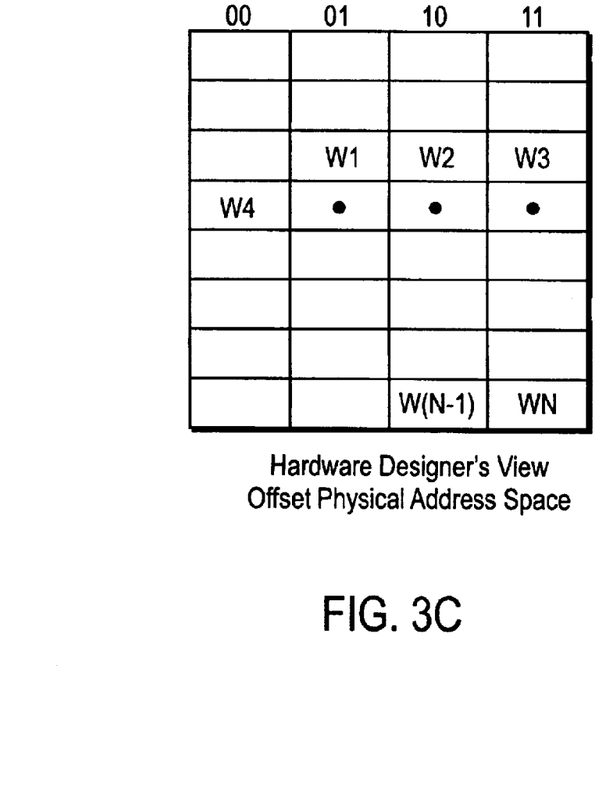
FIG. 3C is diagram illustrating a local data memory from a hardware designer's point of view according to one embodiment of the invention.

FIG. 3C is diagram illustrating a local data memory 202 from a hardware designer's point of view according to one embodiment of the invention. Referring now to FIG. 3C, the starting location of the programmers data is generally started back with an offset such that grid one (01) is located somewhere inside of the memory. Memory access then proceeds to the next word in sequence from W1, W2, W3 and W4. However, it does not do so in linear fashion because it must transition from the word position W3 in memory to the starting position W4 in memory thereby changing the row address. Each time the memory access of a next word requires changing from one row to the next, an off boundary memory access occurs. This would ordinarily require an additional cycle to access the next row. For example, if all four words are desired to be accessed at once e.g. W1, W2, W3 and W4, at least two access cycles would normally be required. The first access would be capable of generating a row address for the words W1, W2 and W3. A next cycle would be required to change to the row access for the word W4. It is desirable to avoid the additional access cycle (e.g. a re-alignment instruction) with an off boundary data memory that can access all four words at substantially the same time within in one cycle, as will now be discussed.

Figure 4:
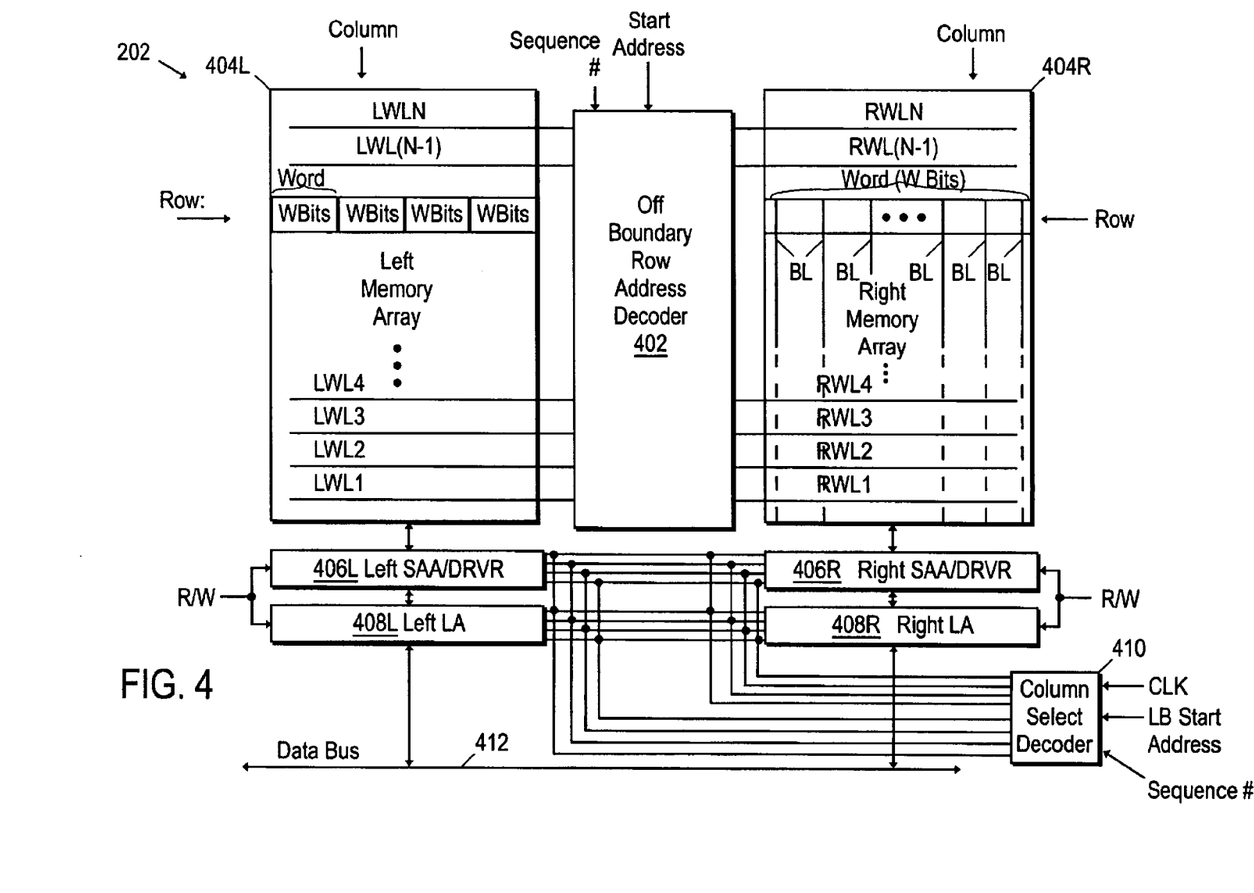
FIG. 4 is a diagram illustrating an off boundary access local data memory according to one embodiment of the invention.

FIG. 4 is a diagram illustrating an off boundary access local data memory according to one embodiment of the invention. Referring now to FIG. 4, the off boundary access local data memory 202 includes an off boundary row address decoder 402, a left memory array 404L having a plurality of left memory rows, a right memory array 404R having a plurality of right memory rows, a left sense amplifier array/driver 406L, a right sense amplifier array/driver 406R, a left latch array 408L, a right latch array 408R, and a column select decoder 410. A row line, or termed word line, includes a right memory and a left memory row, respectively.

The column select decoder 410 receives a starting address for addressing a sequence of words out of the memory arrays 404L and/or 404R.

Off boundary row address decoder 402 is coupled to the right and left memory arrays and turns on the appropriate word line/row for the left memory array 404L and the right memory array 404R. The word lines in left memory array are labeled left word line 1 (LWL1)–left word line N (LWLN) whereas the word lines in the right memory array 404R are labeled right word line 1 (RWL1)–right word line N (RWLN) (see also FIG. 3A). The data in the memory cells in each of the left memory array and right memory arrays are accessible by bit lines which occur in the columns in each of the arrays (e.g. LWBC1–LWBC4 and RWBC1–RWBC4 as shown in FIG. 3A). The bit lines for the bits of the each word can be grouped as shown in the left memory array 404L or can be spread across the entire memory array as illustrated in the right memory array 404R. The left memory array 404L and the right memory array 404R include memory cells to store data for the data memory 202. Each of the memory cells receives a wave line and a bit line depending upon the type of memory cell.

The left and right sense amplify array/drivers 406L and 406R either read data from the memory cells or write data into the memory cells depending upon the read/write signal (R/W) in conjunction with the memory cells that are accessed. The left and right latch arrays 408L and 408R either write data onto the data bus 203 read from the memory 202 or read data from the data bus 203 for writing into the memory 202. The column select decoder 410 receives the least significant bits of a starting address in order to appropriately turn on the sense amplifier arrays and to then latch the data signal.

The column select decoder 410 only turns on those sense amplifiers that are necessary in order to read out the appropriate sequence of data in order to reduce power consumption. The column select decoder 410 separately drives the left sense amplifier 406L and the right sense amplifier 406R to provide support for the off boundary memory access.

The column select decoder 410 also receives a sequence number. The sequence number represents the number of words in sequence to be accessed starting with the starting address. In one embodiment the memory is 2K×16 bits. If each of the memory arrays are 4 width wide, an array in that case is 256 rows high×128 bits wide. Moreover, each of the word lines are capable of accessing four words at a time or 4×16 bits, or 64 bits.

The off boundary row address decoder 402 provides support for off boundary memory access by enabling a right word line of one row while at substantially the same time enabling the left word line of a different row. For example, the off boundary row address decoder 402 enables the right word line 1 (RWL1) to access certain data locations in the right memory array 414R while at substantially the same time enabling the left word line 2 (LWL2) to address the next higher words of data that are desired within approximately one memory cycle.

Figure 5A:
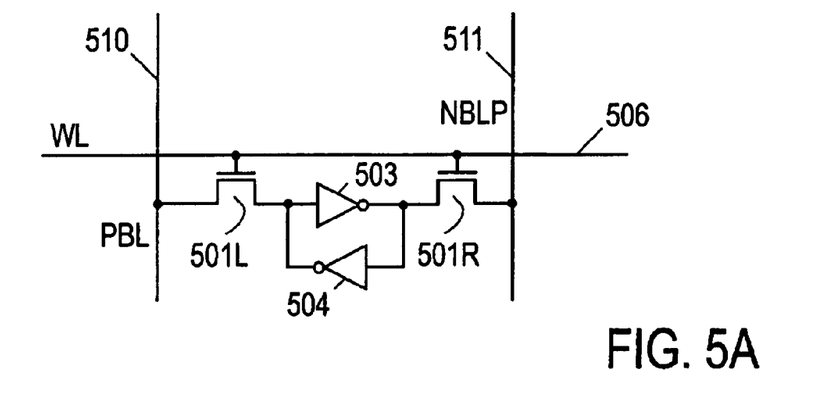
FIG. 5A is a diagram illustrating a static memory cell according to one embodiment of the invention.
Figure 5B:
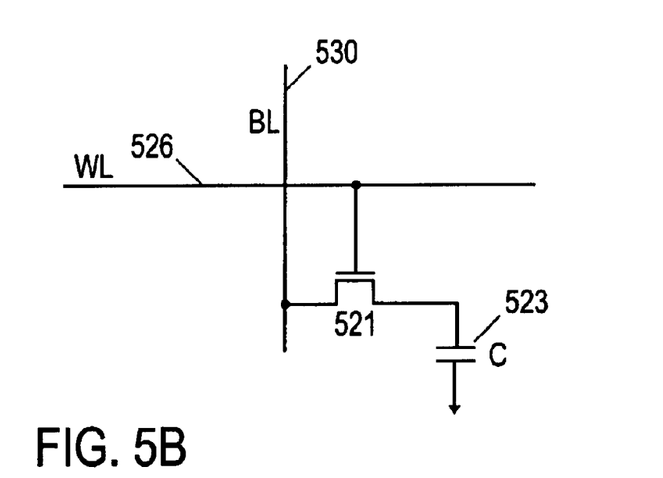
FIG. 5B is a diagram illustrating a dynamic memory cell according to one embodiment of the invention.

FIG. 5A is a diagram illustrating a static memory cell according to one embodiment of the invention. FIG. 5B is a diagram illustrating a dynamic memory cell according to another embodiment of the invention. Referring now to FIGS. 5A and 5B, exemplary memory cells of the memory arrays 404L and 404R are illustrated and discussed.

The static memory cell in FIG. 5A includes a first switch 501L, a second switch 501R, and a pair of cross-coupled inverters 503 and 504. The switches 501L and 501R are controlled by the row line 506 to allow access to the data stored in the pair of inverters 503 and 504. The switch 501L is coupled on one side to the positive bit line 510 and the parallel cross-coupled inverter's on and off bit sides, respectively, on an opposite side. Conversely, the switch 501R is coupled to the negative bit line NBL 511 on one side and the parallel cross-coupled inverter's on and off bit sides, respectively, on an opposite side. The static memory cell depicted in FIG. 5A can receive a differential signal between the positive bit line PBL 510 and the negative bit line NBL 511. The pair of cross coupled inverters 503 and 504 can ride out a differential signal onto the positive line PBL 510 and the negative bit line NBL 511. Each static memory cell is static in the sense that the data that is stored by the cross coupled inverters 503 and 504 is typically not destroyed when it is accessed.

FIG. 5B is a diagram illustrating a dynamic memory cell according to another embodiment of the invention. The dynamic memory cell includes a switch 521 and a capacitor 523 that is coupled to the switch 521. Switch 521 is controlled by a row line 526. The switch is coupled on one side to a single bit line 530 and one plate of the capacitor 523 on an opposite side. The dynamic memory cell because of its fewer components is much smaller than the static memory cell of FIG. 5A. However, the charge ordinarily stored on the capacitor 523 is destroyed when the memory is let out onto the bit line 530. In this case a thresh cycle may be necessary in order to write the data that was previously let out back into the cells to store it once again.

In each of these memory cells the row or grid line is generally in the row of cells and the bit line is in the column of the cells. To form a word of memory cells a number of them may be grouped together in a row. Each of the bit lines from the memory cells couple into the left or right sense amplifier array 406L or 406R.

Figure 6:
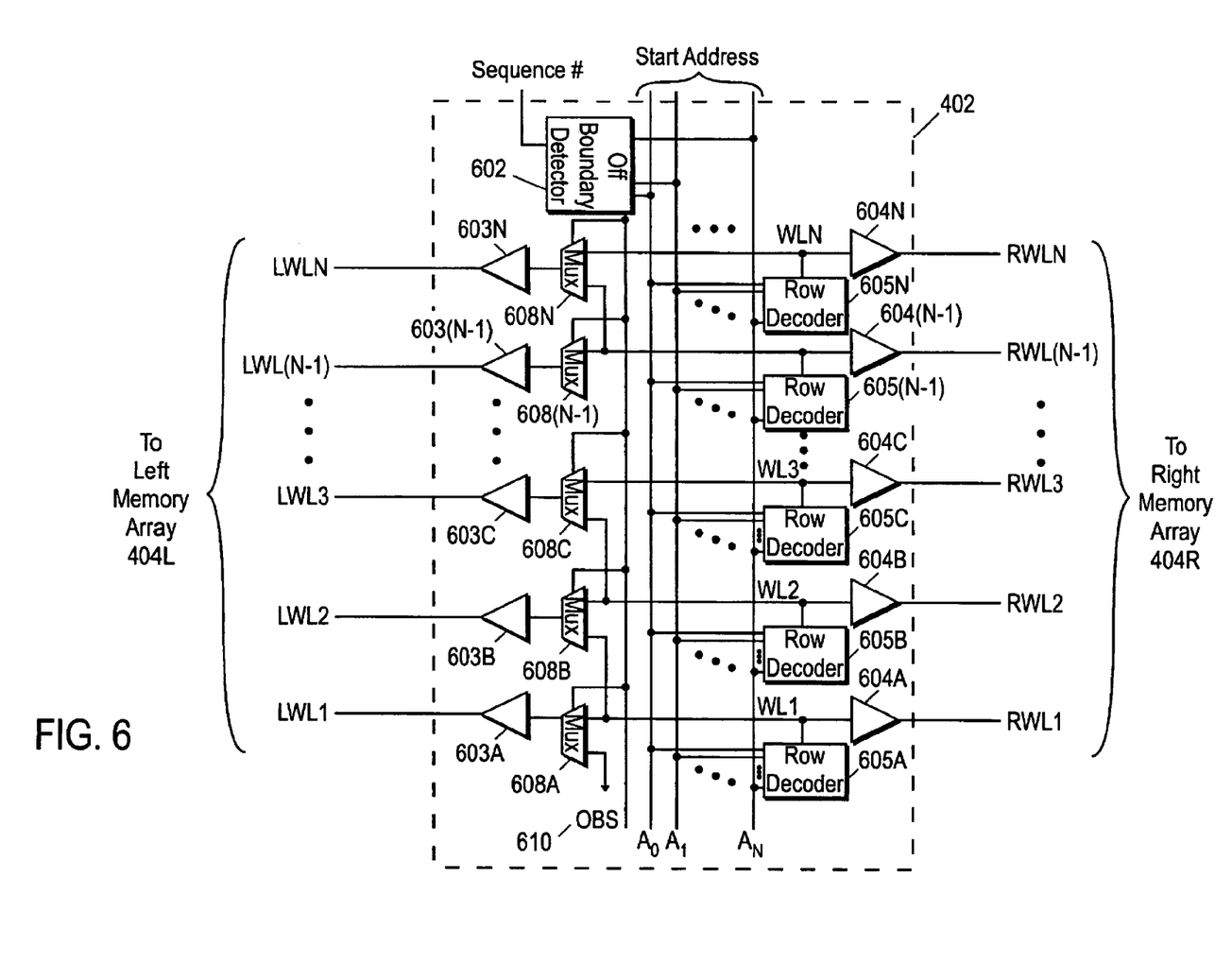
FIG. 6 is a block diagram illustrating the off boundary row address decoder according to one embodiment of the invention.

FIG. 6 is a block diagram illustrating the off boundary row address decoder 402 according to one embodiment of the invention. Referring now to FIG. 6, the off boundary row address decoder 402 receives the starting address and the sequence number for the number of words that are desired to be accessed out of the local data memory 202. The starting address is provided as an address $A_0-A_N$. Off boundary row address decoder 402 includes an off boundary detector 602, a plurality of first word line buffers 603A–603N, and a plurality of second word line buffers 604A–604N, N row decoders 605A–605N, and N multiplexers 608A–608N.

The N second word line buffers 604A–604N buffer the load from the row lines of the right memory array 404R. The N first word line buffers 603A–603N buffer the load from the row lines of the left memory array 404L.

Each of the row decoders 605A–605N receive the starting address. Each row decoder decodes a unique address for the words that are contained in each row line. Each row decoder is coupled to a respective left and right memory row of a row line. For example, row decoder 605A will generate an output signal (e.g. word line signal) in response to a starting address of $00_h$ though $07_h$ (see FIG. 3A). Each of the row decoders generates an output signal in response to a range of words having a respective starting address. Only one of the row decoders 605A–605N generates a word line signal at a time.

The multiplexers 608A–608N are provided in order to select a different word line (i.e. row) from that of the word line (i.e. row) originally selected by the respective row decoder (e.g. from a right word line to a next higher left word line). Except for the multiplexer 608A, each multiplexer 608B–608N receives as an input the lower row decoder signal from the lower respective row decoder and its own row decoder signal from its own respective row decoder.

For example, multiplexer 608B receives a word line 1 signal (for row 1) from the row decoder 605A as well as the word line 2 signal (for row 2) from the row decoder 605B. It should be noted that multiplexer 608A receives ground as one input and the word line 1 signal from the row decoder 605A. In this case the multiplexer 608A selects between its own row decoder signal, or ground, to turn off the switches coupled to the left row line 1. Also, multiplexer 608A has one of its sets of inputs coupled to ground in case the second word line, left word line 2 (LWL2), is selected so that LWL1 is then grounded.

Each of the multiplexers 608A–608N receives an off boundary signal OBS 610 as its control input. The off boundary signal OBS 610 is generated by the off boundary detector 602 in response to the starting address and the sequence number. The off boundary detector is also responsive to the organization of memory arrays and in particular the number of words across each of the left and right memory arrays. That is the logic within the off boundary detector is tailored towards the organization of the memory array. The off boundary detector 602 knowing the starting address determines in which column the starting address begins and whether or not the sequence number requires enabling of the next higher word line where other words may be located. If the starting address and the sequence of words requires enabling the next higher word line, then the off boundary signal is generated and the multiplexers are appropriately controlled so that the lower word line controlling the right memory array is coupled into the upper next higher word line of the left memory array. In this manner the off boundary rear address decoder 402 provides off boundary memory accessing.

With reference to FIG. 6 in conjunction with FIG. 3A, the operation of the off boundary row address decoder 402 will now be discussed for illustrative purposes. For example, assume the off boundary row address decoder 402, including the off boundary detector 602, receives a start address (e.g. provided as an address $A_0$–$A_N$) corresponding to the word address $07_h$ and a sequence number of 4 thus requesting a desired plurality of memory addresses of $07_h$, $08_h$, $09_h$ and $0A_h$.

Each of the row decoders 605A–605N receives this starting address. In this example, row decoder 605A, which generates an output signal (e.g. word line signal) in response to a starting address of $00_h$ though $07_h$, generates an output signal for the memory address $07_h$. For the starting address of $07_h$, the row decoder 605A enables the right word line 1 (RWL1) and the bit line for the right word bit column 4 (RWBC4) to select address $07_h$ in the right memory array 404R.

Because a sequence number of four has been selected, such that the data at addresses $08_h$, $09_h$, and $0A_h$ have been selected, and since $07_h$ is at the far right end of right word line 1 (RWL1), the off boundary detector 602 determines that an off boundary access is required. Accordingly, the off boundary detector generates an off boundary signal OBS 610 as a control input to the multiplexers 605A–605N. Particularly, the off boundary signal OBS 610 in this instance controls multiplexer 608A and 608B so that after data address $07_h$ is accessed, multiplexer 608A is grounded and multiplexer 608B is enabled to select a different row line, left word line 2 (LWL2). Thus, data can be accessed from the right word line 1 (RWL1) to the next higher left word line 2 (LWL2) from the data memory 202.

Multiplexer 608B enables row decoder 605B to transmit output signals (e.g. word line signals) to the left memory array 404L for accessing memory addresses $08_h$, $09_h$, and $0A_h$. For the address of $08_h$, the row decoder 605B enables the left word line 2 (LWL2) and the left word bit column 1 (LWBC1) to be selected. Further, for the address of $09_h$, the row decoder 605B enables the left word line 2 (LWL2) and the left word bit column 2 (LWBC2) to be selected, and for the address of $0A_h$, the row decoder 605B enables the left word line 2 (LWL2) and the left word bit column 3 (LWBC3) to be selected. Accordingly, the off boundary detector allows memory access to the sets of data at addresses $07_h$, $08_h$, $09_h$, and $0A_h$ within one memory cycle at substantially the same time.

Thus, a plurality of data words can be accessed from any point in memory at substantially the same time within one memory access cycle. This avoids limitations of previous memories which often need two memory access cycles (i.e. requiring an extra re-alignment instruction) when an off boundary memory access is required.

Furthermore, the invention for an off boundary memory works with the architecture of the disclosed core signal processor 200 for performing digital signal processing instructions. As shown in FIG. 2, in one embodiment, the core signal processor 200 has four signal processing units 300A–D coupled to a local data memory 202 by a data bus 203. By using the off boundary memory 202 according to one embodiment of the invention, data can be more efficiently fed to signal processing units 300. For example, four data words can be accessed from the off boundary memory 202 at a time and each data word can be fed to a signal processing unit 300 simultaneously for digital signal processing. If the starting address of a data word requires an off boundary memory access this does not significantly slow down the operation of the four signal processors as the four data words can be accessed from the off boundary local memory at substantially the same time within one memory access cycle. In this way, the invention for an off boundary memory increases the efficiency of the execution of digital signal processing (DSP) instructions on accessed data by the four signal processing units.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Also, while the invention has been described in particular embodiments, it may be implemented in hardware, software, firmware or a combination thereof and utilized in systems, subsystems, components or sub-components thereof. When implemented in software, the elements of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. In any case, the invention should not be construed as limited by such embodiments, but rather construed according to the claims that follow below.

What is claimed is:

1. A memory to provide off boundary memory access,
   a right memory array having a plurality of right memory rows;
   a left memory array having a plurality of left memory rows;
   a plurality of row lines each having a right memory row and left memory row, respectively; and
   an off boundary row address decoder coupled to the right and left memory arrays, the off boundary row address decoder to perform an off boundary memory access and wherein the off boundary row address decoder includes a plurality of row decoders, each row decoder coupled to a respective left and right memory row of a row line, the row decoder to decode an address to access the desired plurality of memory addresses data within the respective left and right memory row of the row line and wherein each row decoder is coupled to at least one adjacent row decoder by a multiplexer.

2. The memory of claim 1, wherein, the memory is an off boundary memory.

3. The memory of claim 1, wherein, the off boundary memory access includes accessing a desired plurality of memory addresses from one of a right or left memory row of a row line and from one of a left or right memory row of an adjacent row line.

4. The memory of claim 1, wherein, the off boundary memory access to be performed within one memory access cycle.

5. The memory of claim 1, wherein, the off boundary row address decoder to select appropriate right and left memory rows based upon a starting address and a sequence number to access the desired plurality of memory addresses.

6. The memory of claim 1, further comprising:
a column select decoder to select appropriate bit columns of right and left memory rows based upon a starting address and a sequence number to access the desired plurality of memory addresses.

7. The memory of claim 1, wherein, the off boundary row address decoder further includes an off boundary detector coupled to each of the multiplexers.

8. The memory of claim 7, wherein based upon a starting address and a sequence number, the off boundary detector to determine whether an off boundary memory access is needed, and if so, the off boundary memory detector to generate an off boundary signal to control the multiplexers.

9. The memory of claim 8, wherein, the off boundary signal to control the multiplexers in that after the memory addresses from one of a right or left memory row of a first row line selected by a row decoder are accessed, then the appropriate memory addresses from one of a left or right memory row of an adjacent row line to be accessed by an adjacent row decoder.

10. A signal processor comprising:
at least one signal processing unit, the at least one signal processing unit coupled to an off boundary memory by a data bus,
the off boundary memory including
a right memory array having a plurality of right memory rows;
a left memory array having a plurality of left memory rows;
a plurality of row lines each having a right memory row and left memory row, respectively; and
an off boundary row address decoder coupled to the right and left memory arrays, the off boundary row address decoder to perform an off boundary memory access, wherein the off boundary row address decoder includes a plurality of row decoders, each row decoder coupled to a respective left and right memory row of a row line, the row decoder to decode an address for accessing the desired plurality of memory addresses data within the respective left and right memory row of the row line, wherein each row decoder is coupled to at least one adjacent row decoder by a multiplexer.

11. The signal processor of claim 10, wherein, the signal processor is a digital signal processor to perform digital signal processing instructions.

12. The signal processor of claim 10, wherein, the off boundary memory access includes accessing a desired plurality of memory addresses from one of a right or left memory row of a row line and from one of a left or right memory row of an adjacent row line.

13. The signal processor of claim 10, wherein, the off boundary memory access to be performed within one memory access cycle.

14. The signal processor of claim 10, wherein, the off boundary row address decoder to select appropriate right and left memory rows based upon a starting address and a sequence number to access the desired plurality of memory addresses.

15. The signal processor of claim 10, further comprising:
a column select decoder to select appropriate bit columns of right and left memory rows based upon a starting address and a sequence number to access the desired plurality of memory addresses.

16. The signal processor of claim 10, wherein, the off boundary row address decoder further includes an off boundary detector coupled to each of the multiplexers.

17. The signal processor of claim 16, wherein based upon a starting address and a sequence number, the off boundary detector to determine whether an off boundary memory access is needed, and if so, the off boundary detector to generate an off boundary signal to control the multiplexers.

18. The signal processor of claim 17, wherein, the off boundary signal to control the multiplexers in that after the memory addresses from one of a right or left memory row of a first row line selected by a row decoder are accessed, then the appropriate memory addresses from one of a left or right memory row of an adjacent row line are accessed by an adjacent row decoder.

19. A method to provide off boundary memory access in a memory, the method comprising:
apportioning a memory into a right memory array having a plurality of right memory rows an a left memory array having a plurality of left memory rows;
defining a plurality of row lines each having a right memory row and left memory row, respectively;
performing an off boundary memory access by accessing a desired plurality of memory addresses from one of a right or left memory row of a row line and from one of a left or right memory row of an adjacent row line;
decoding an address for accessing the desired plurality of memory addresses data within a respective left and right memory row of a row line; and
coupling each row line to at least one adjacent row line by a multiplexer.

20. The method of claim 19, wherein, the off boundary memory access is performed within one memory access cycle.

21. The method of claim 19, further comprising:
selecting appropriate right and left memory rows based upon a starting address and a sequence number to access the desired plurality of memory addresses.

22. The method of claim 19, further comprising:
selecting appropriate bit columns of right and left memory rows based upon a starting address and a sequence number to access the desired plurality of memory addresses.

23. The method of claim 19, further comprising:
Determining whether an off boundary memory access is needed based upon a starting address and a sequence number, and if so, generating an off boundary signal to control the multiplexers.

24. The method of claim 23, wherein,
the off boundary signal controls the multiplexers in that after the memory addresses from one of a right or left memory row of a first row line are accessed,
then the appropriate memory addresses from one of a left or right memory row of an adjacent row line are accessed.

* * * * *